United States Patent [19]

Heiter

[11] Patent Number: 4,621,244

[45] Date of Patent: Nov. 4, 1986

[54] BROADBAND VARIABLE ATTENUATOR USING TRANSMISSION LINES SERIES COUPLED BY ADJUSTABLE PIN DIODES

[75] Inventor: George L. Heiter, Andover, Mass.

[73] Assignee: AT&T Bell Laboratories, Murray Hill, N.J.

[21] Appl. No.: 611,331

[22] Filed: May 17, 1984

[51] Int. Cl.⁴ .......................... H03H 7/25; H01P 1/22
[52] U.S. Cl. ................................. 333/81 A; 307/540; 307/565
[58] Field of Search .................. 333/81 A, 81 R, 246; 307/540, 547, 551, 561, 565, 566

[56] References Cited

U.S. PATENT DOCUMENTS

| | | | |
|---|---|---|---|
| 3,346,805 | 10/1967 | Hekimian | 333/81 R |
| 3,432,778 | 3/1969 | Ertel | 333/81 R |
| 3,453,564 | 7/1961 | Russell | 333/81 R |
| 3,529,266 | 9/1970 | King | 333/81 R |
| 3,652,959 | 3/1972 | Denny | 333/81 R |
| 3,713,037 | 1/1973 | Hopfer | 333/81 A |
| 3,774,123 | 11/1973 | Hume | 333/81 A X |
| 3,775,708 | 11/1973 | Sly | 333/81 A |
| 4,047,131 | 9/1977 | Ludikhuize | 333/81 R |
| 4,097,827 | 6/1978 | Williams | 333/81 A X |
| 4,216,455 | 8/1980 | Abajian | 333/81 R |
| 4,236,126 | 11/1980 | Weller et al. | 333/81 R |
| 4,359,699 | 11/1982 | Horkin | 333/81 A |
| 4,438,415 | 3/1984 | Hopfer | 333/81 A |

FOREIGN PATENT DOCUMENTS 0517964  7/1976  U.S.S.R. ............ 333/81 R

OTHER PUBLICATIONS

Stachejko, Vitaly; "Multi Function Diode Device"; RCA Technical Note; TN No. 957, Mar. 15, 1974.
Okean et al., IEEE-GMTT 1971, Washington, D.C., May 16–19, pp. 180–181.
Parris, IEEE Trans. MTT, vol. MTT-20, No. 9, Sep. 1972, pp. 618–619.
Ananasso, IEEE Trans. MTT, vol. MTT-28, No. 7, Jul. 1980, pp. 774–776.

Primary Examiner—Eugene R. LaRoche
Assistant Examiner—B. Lee
Attorney, Agent, or Firm—Erwin W. Pfeifle

[57] ABSTRACT

The present invention relates to a broadband variable attenuator comprising a two- or three-section transmission line with a separate PIN diode bridging each of the two gaps between the adjacent ends of the transmission line sections. The two PIN diodes are disposed in series opposition and the first, second and third transmission line sections are connected to a diode variable biasing source to cause (a) substantially a total reflection of an input signal to the attenuator for a bias below a first value, (b) substantially a total transmission of an input signal through the diodes for a bias above a second value, and (c) a selected amount of both partial reflection and partial transmission of an input signal for a bias value between the first and second values. The broadband variable attenuator can be implemented using microstrip, stripline or coaxial technology without the need of d-c isolation capacitors or applique resistors while providing a maximum insertion loss under zero bias conditions.

13 Claims, 5 Drawing Figures

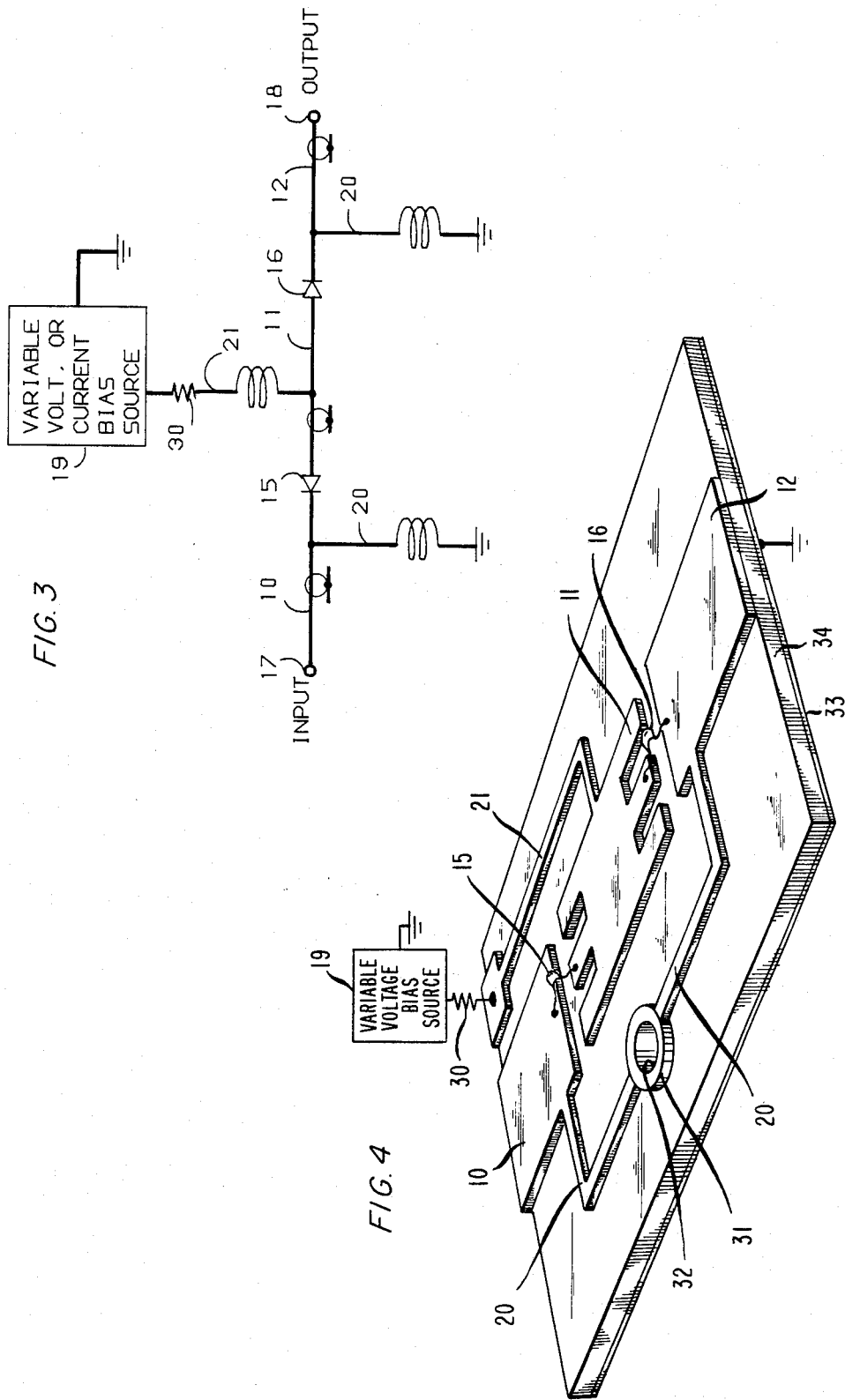

BROADBAND VARIABLE ATTENUATOR USING TRANSMISSION LINES SERIES COUPLED BY ADJUSTABLE PIN DIODES

TECHNICAL FIELD

The present invention relates to a broadband variable attenuator which can be implemented using coaxial, stripline or microstrip technology. More particularly, the present variable attenuator comprises a three-section serially arranged transmission line with a separate PIN diode, of a pair of PIN diodes arranged in series opposition, interconnecting the ends of each of two adjacent transmission line sections, and biasing means for selectively biasing the diodes to provide either substantially complete reflection of an input signal, substantiallly complete transmission of an input signal, or partial reflection and transmission of an input signal in various degrees depending upon the bias applied.

DESCRIPTION OF THE PRIOR ART

For a number of microwave circuits, such as, for example, an interference canceller used in a digital radio system, a device is needed which disables the circuitry in a fail-safe manner when certain malfunctions occur. This function can be performed by a variable attenuator/amplitude modultor when used in a switching mode between minimum and maximum attenuation such that maximum attenuation is obtained when no external control signal is applied. Variable attenuators can, of course, also be used for other applications and in the prior art have generally included a number of mechanical and electronic devices.

Typical electronic variable attenuating devices have included one or more PIN diodes connected in various series and parallel configurations as disclosed, for example, in U.S. Pat. Nos. 3,529,266 issued to F. N. King on Sept. 15, 1970; 3,713,037 issued to S. Hopfer on Jan. 13, 1973; 3,775,708 issued to T. L. Sly on Nov. 27, 1973; 4,047,131 issued to A. W. Ludikhuize on Sept. 6, 1977 and 4,216,445 issued to A. Abajian on Aug. 5, 1980. These arrangements usually include various other network components such as resistors, capacitors and inductors to control, for example, the absorption of an input signal internal to the attenuator.

The problem remaining in the prior art is that the various variable attenuator designs require the extra network components of resistors, inductors and capacitors which make the variable attenuators more expensive and not easy to implement on existing microstrip circuits with minimal incremental cost. Additionally, these circuits do not provide a fail-safe feature which may be required in interference cancellers of radio systems where a maximum insertion loss is obtained under a zero bias condition.

SUMMARY OF THE INVENTION

The foregoing problems in the prior art have been solved in accordance with the presentinvention which relates to broadband variable attenuator which can be implemented using coaxial, stripline or microstrip technology. More particularly, the present variable attenuator comprises a three-section serially arranged transmission line with a separate PIN diode, of a pair of PIN diodes arranged in series opposition, interconnecting the ends of each of two adjacent transmission line sections. A biasing arrangement selectively biases the two diodes to provide either substantially complete reflection of an input signal, substantially complete transmissions of an input signal, or partial reflection and transmission of an input signal in various degrees depending on the bias applied.

Other and further aspects of the present invention will become apparent during the course of the following description and by reference to the accompanying drawings.

BRIEF DESCRIPTION OF THE DRAWINGS

Referring now to the drawings:

FIG. 3 is a typical circuit diagram of the arrangement of FIG. 1 in coaxial cable form;

FIG. 4 is a view in perspective of the arrangement of FIG. 1 in microstrip form.

DETAILED DESCRIPTION

Figure 5:
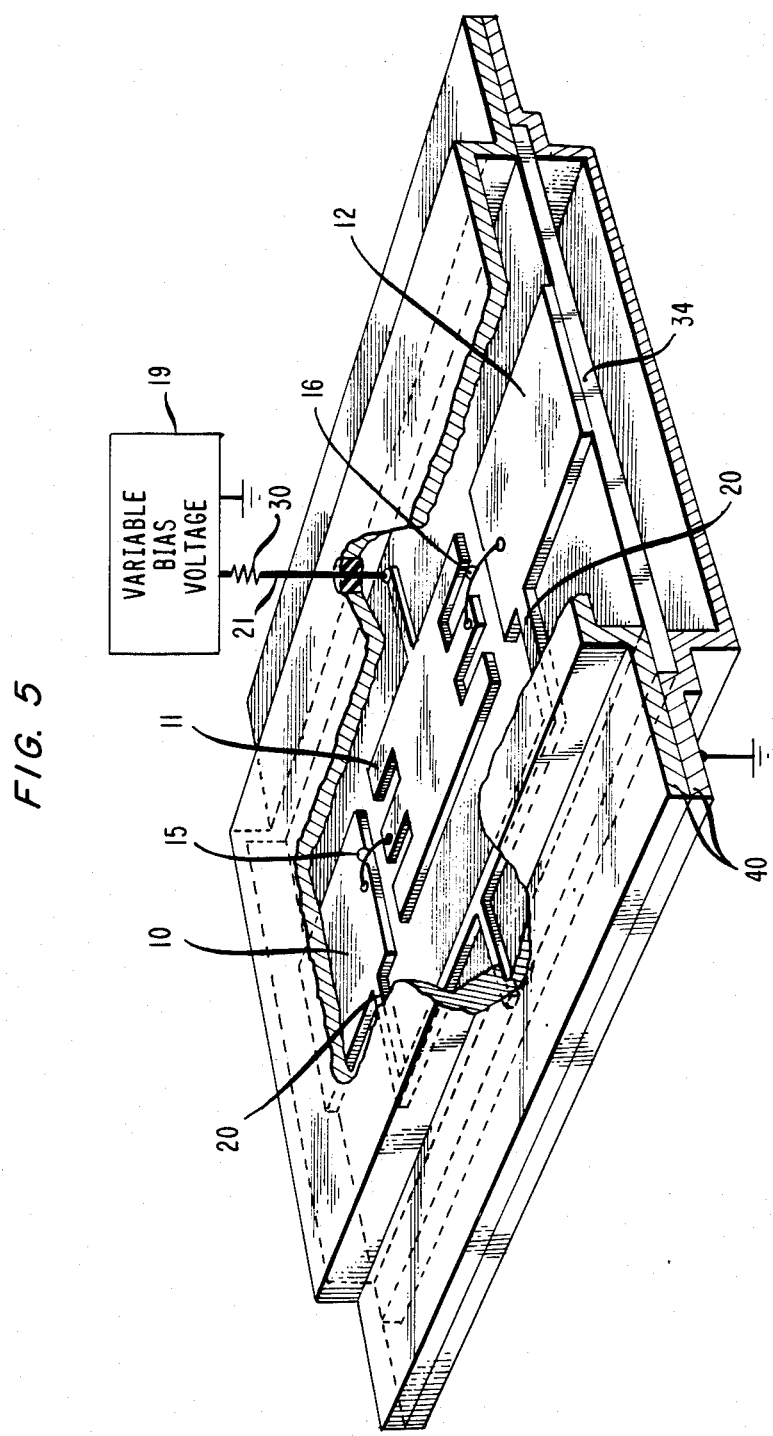
FIG. 5 is a view in perspective of the arrangement of FIG. 1 in stripline form.

The present invention relates to a broadband variable attenuator which can be used for various applications as, for example, in an interference canceller in a digital radio system to disable the canceller in a fail-safe manner when certain malfunctions occur. The description which follows is directed to the structure of the present variable attenuator in a microstrip arrangement, but it is to be understood that such description is merely for purposes of exposition and not for purposes of limitation since the present invention could also be implemented using coaxial or stripline technology as shown in FIGS. 3 and 5, respectively.

Figure 1:
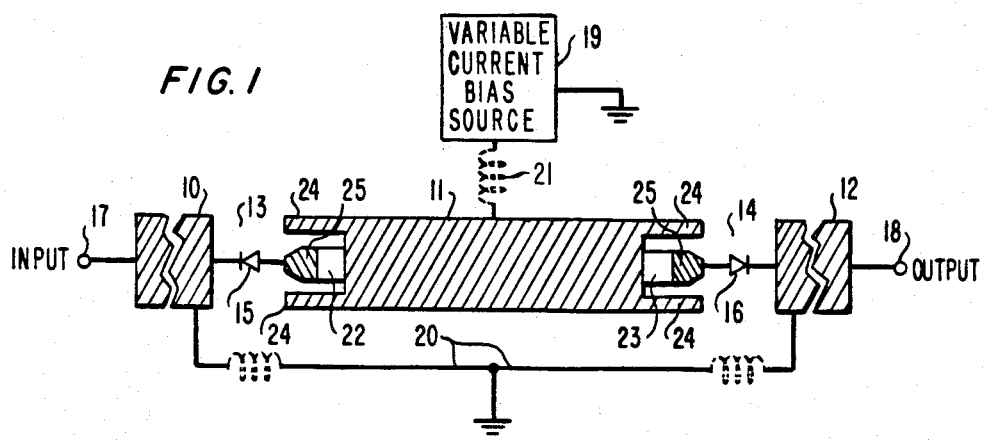
FIG. 1 is an arrangement of a preferred embodiment of a variable attenuator in microstrip form in accordance with the present invention.

FIG. 1 illustrates a preferred arrangement of the present variable attenuator which comprises three serially arranged sections 10, 11 and 12 of a microstrip transission line separated by two narrow gaps 13 and 14 which are bridged by beam leaded PIN diodes 15 and 16, respectively, arranged in series opposition to each other. Transmission line section 10, at the end opposite gap 13, is connected to an input terminal 17 for receiving an input signal from a predetermined source of signals. Transmission line section 12, at the end opposite gap 14, is connected to an output terminal 18 for delivering an input signal which has been selectively attenuated by the present variable attenuator arrangement to a predetermined end user or circuit.

Transmission line section 11 is coupled at a first and second end thereof to the PIN diodes 15 and 16, respectively, and to a variable current bias source 19, which source is also connected to ground. It is to be understood that variable bias source 19 can comprise any means which will provide a suitable bias to the PIN diodes 15 and 16. For example, variable bias source 19 can alternatively comprise a variable voltage bias source as shown in FIG. 4 with a bias resistor 30 disposed at the output of source 19 for limiting the current to diodes 15 and 16 in case one of the diodes happens to short out. Transmission line sections 10 and 12 are shown as being further connected to ground. In a microstrip configuration, this ground can be provided through a grounding pad 31 with plated through holes 32, as shown in FIG. 4 to a grounded backplane 33 on the substrate 34. It should be understood that in any configuratin, be it microstrip, coaxial or stripline, the leads 20 from transmission line sections 10 and 12 to ground and the lead 21 from bias source 19 to transmission line section 11 should be of sufficient length and size to act as a sufficient inductor for decoupling any microwave energy propagating therethrough. The center section, comprising transmission line section 11, can be seen to be d-c isolated from the outer transmission line sections 10 and 12. It is to be understood that, alternatively, variable bias source 19 could be changed to become a variable bias sink (i.e., its polarity could be reversed) in which case the polarities of PIN diodes 15 and 16 should be reversed from that shown in FIG. 1.

In operation, as the bias and the forward diode current in diodes 15 and 16 is varied, the bridging impedance varies ideally between open circuit and short circuit conditions. Thus, in the extremes, either substantially total reflection or substantially total transmission of the incident input microwave energy, respectively, occurs. It is to be understood that when the bridging impedance is somewhere between the open circuit and short circuit conditions, the incident input microwave energy would be partially reflected and partially transmitted, with the amount of the input signal being partially transmitted and reflected being determined by the bias current value at any instant of time. Therefore, by properly adjusting the bias current to PIN diodes 15 and 16, the input reflection coefficient can be varied over a wide dynamic range. The extremes are determined by the diode parameters and the details of the microstrip or other design.

If the remaining micrstrip circuitry on the same substrate employs microstrip resistors, then optional ballasting resistors 22 and 23, disposed at the ends of transmission line section 11, and an optional bias resistor (not shown in the path between source 19 and transmission line section 11) can be provided. The two optional ballasting resistors 22 and 23 would be of a low value, e.g., 10 ohms, and disposed in series with PIN diodes 15 and 16, respectively, to compensate for variations in the forward bias characteristics of the PIN diodes resulting in an approximately equal distribution of bias currents. The optional bias resistor between variable bias source 19 and transmission line section 11 (typically 100 ohms) increases the internal impedance of the bias circuitry and allows better control of the bias currents, and provides overcurrent protection. It is to be understood that this optional bias resistor can be supplied in variable bias source 19.

Also shown in FIG. 1 are projecting end sections 24 on transmission line section 11 and separate projecting bonding pads 25 at both ends of transmission line section 11 for connection to PIN diodes 15 and 16. The bonding pads 25 are shown as being formed of the same material as transmission line section 11. The combination of the end projections 24 and an adjacent bonding pad 25 provides one predetermined capacitance therebetween while the widths of gaps 13 and 14 between the end projections 24 and their adjacent ends of transmission lines 10 and 12, respectively, provide a second capacitance to optimally design device performance as desired. It is to be understood that resistors 22 and 23 together with end projections 24 and bonding pads 25 are optional and could be eliminated and the appropriate side of each of diodes 15 and 16 bonded directly to a separate squared-off end of transmission line section 11. Alternatively, resistors 22 and 23 together with end projections 24 and bonding pads 25 could be located in transmission lines 10 and 12 immediately adjacent to gaps 13 and 14, respectively.

Figure 2:
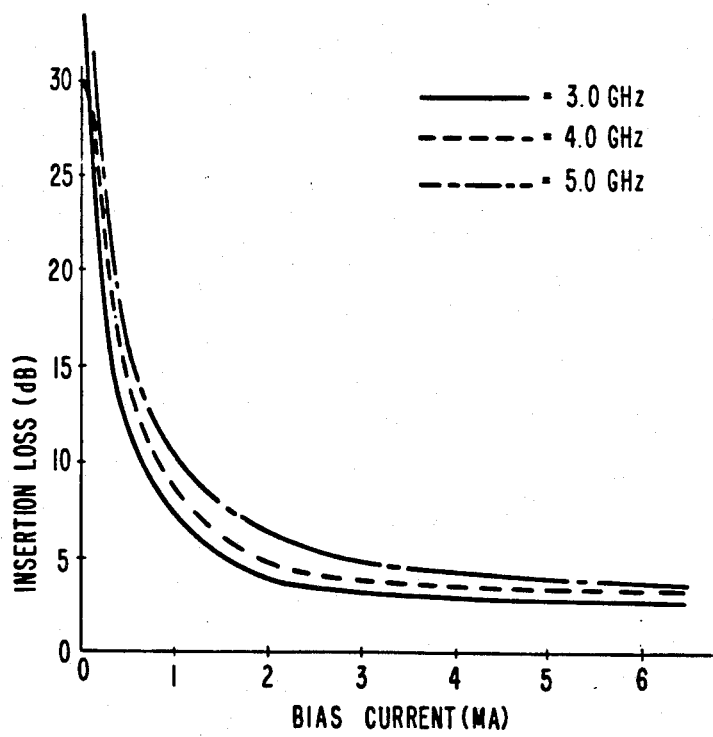
FIG. 2 illustrates typical curves of the dependence of insertion loss on bias current for the arrangement of FIG. 1 for three different frequencies.

FIG. 2 shows curves of the dependence of insertion loss on bias current for three different frequencies for an attenuator in accordance with FIG. 1 that was constructed using AT&T WE type 811A PIN diodes with a 0.48 mm wide microstrip line on a 0.025 inch thick alumina substrate. FIG. 2 further shows that the device also provides the desired fail-safe feature since maximum insertion loss of >30 dB is obtained under zero bias conditions. It is to be understood that the use of other PIN diodes or transmission line configurations or other details of construction would change the indicated curves.

One purpose of the two-diode arrangement of FIG. 1 is to ensure that input 17 and output 18 remain at ground potential at all times, independent of the potential of bias source 19. In certain cases, dc isolation is provided within transmission line 11, as, for example, in the case where transmission line 11 contains a section of waveguide. Such waveguide may provide other system functions such as frequency filtering. In such cases, a single diode, that is one-half of the configuration shown in FIG. 1, will provide similar functions although some degradation in performance may be expected from this embodiment.

FIG. 5 is a view in perspective of the arrangement of FIGS. 1 and 4 in stripline form where the substrate 34 does not include a backplane 33 and is suspended in a surrounding fixture 40, as is well known in the art. Transmission line sections 10 and 12 are grounded to housing 40 via leads 20 which contact housing 40 when substrate 34 is mounted within housing 40.

What is claimed is:

1. A broadband variable attenuator comprising:
 a first transmission line section comprising a first and a second end for receiving an input signal at the first end and directly propagating the input signal to the second end;
 a second transmission line section comprising a first end disposed adjacent the second end of the first transmission line section in a non-contacting relationship, and a second end for providing an output signal;
 a variable bias source comprising first and second terminals inductively connected to the first and second transmission lines, respectively, for selectively providing any one of a plurality of bias values between the second end of the first transmission line and the first end of the second transmission line; and
 a PIN diode interconnecting the second end of the first transmission line section and the first end of the second transmission line section, the PIN diode being responsive to the selectively provided one of the plurality of bias values across the diode to cause (a) the diode to be in the non-conductive state and cause substantially a total reflection of an input signal back to the first end of the first transmission line when the selected bias value across the diode is below a first predetermined value, (b) the diode to be in a fully conductive state and cause substantially a complete transmission of an input signal through the PIN diode to the second end of the second transmission line when the selected bias value across the diode is above a second predetermined value, and (c) the diode to be in a low forward bias state to cause a selective amount of the combination of partial reflection of the input signal back to the first end of the first transmission line and partial transmission of the input signal through the PIN diode to the second end of the second transmission line when the selected bias values across the diode is selectively disposed between the first and second predetermined values, the three states of the PIN diode providing a variable amount of attenuation of the energy of the input signal before reaching the second end of the second transmission line.

2. A broadband variable attenuator according to claim 1 wherein the attenuator further comprises:

a third transmission line section comprising a first end disposed adjacent the second end of the second transmission line section in a non-contacting relationship therewith, and a second end for directly receiving a signal applied to the first end of said third transmission line and applying said signal to an output device, the third transmission line being inductively connected to the first terminal of the variable bias source for selectively providing any one of the plurality of bias values between the first end of the third transmission line section and the second end of the second transmission line section; and a second PIN diode interconnecting the second end of the second transmission line section and the first end of the third transmission line section, the second PIN diode being connected in series opposition with the first PIN diode and responsive to the selectively provided one of the plurality of bias values between the second end of the second transmission line section and the first end of the third transmission line section to cause (a) the second diode to be in a non-conductive state and cause substantially total reflection of a signal propagating in the second transmission line section towards the second PIN diode back towards the first PIN diode when the selectively provided bias value is below the first predetermined value, (b) the second diode to be in a fully conductive state and cause substantially a complete transmission of a signal propagating in the second transmission line section through the second PIN diode and to the second end of the third transmission line section when the selectively provided bias value is above the second predetermined value, and (c) the diode to be in a low forward bias state to cause a selective amount of the combination of partial reflection of the signal back towards the first PiN diode and partial transmission of the signal propagating in the second transmission line section through the second PIN diode and to the second end of the third transmission line section when the selectively provided bias value is selectively disposed between the first and second predetermined values, the three states of the second PIN diode selectively providing a variable amount of attenuation to the energy of a signal applied to the second PIN diode.

3. A broadband variable attenuator according to claim 1 or 2 wherein the variable bias source is a variable current bias source, the first and second terminals being inductively connected to the associated transmission line sections with separate leads which each provide an inductance of a value which prevents microwave energy from reaching the variable current bias source.

4. A broadband variable attenuator according to claim 1 or 2 wherein the variable bias source is a variable voltage bias source, the first and second terminals of the variable voltage bias source being inductively connected to the associated transmission line sections with leads which provide an inductance of a value which prevents microwave energy from reaching the variable voltage bias source; and the variable attenuator further comprising;

a ballast resistor disposed at the output of the variable voltage bias source in the lead connecting the second terminal to the second transmission line to limit the current to the first and second PIN diodes if one of said diodes is shorted.

5. A broadband variable attenuator according to claim 1 or 2 wherein the transmission line sections are separate microstrip transmission line sections formed on a substrate.

6. A broadband variable attenuator according to claim 1 or 2 wherein the transmission line sections are separate coaxial line sections.

7. A broadband variable attenuator according to claim 1 or 2 wherein the transmission line sections are separate stripline sections.

8. A broadband variable attenuator according to claim 3 wherein the transmission line sections are separate microstrip transmission line sections formed on a substrate.

9. A broadband variable attenuator according to claim 3 wherein the transmission line sections are separate coaxial line sections.

10. A broadband variable attenuator according to claim 3 wherein the transmission line sections are separate stripline sections.

11. A broadband variable attenuator according to claim 4 wherein the transmission line sections are separate microstrip transmission line sections formed on a substrate.

12. A broadband variable attenuator according to claim 4 wherein the transmission line sections are separate coaxial line sections.

13. A broadband variable attenuator according to claim 4 wherein the transmission line sections are separate stripline sections.

* * * * *